United States Patent
Chan et al.

(10) Patent No.: US 11,174,551 B2
(45) Date of Patent: Nov. 16, 2021

(54) METHODS FOR DEPOSITING TUNGSTEN ON HALOSILANE BASED METAL SILICIDE NUCLEATION LAYERS

(71) Applicant: Applied Materials, Inc., Santa Clara, CA (US)

(72) Inventors: Kelvin Chan, San Ramon, CA (US); Yihong Chen, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 472 days.

(21) Appl. No.: 15/615,790

(22) Filed: Jun. 6, 2017

(65) Prior Publication Data

US 2017/0350013 A1    Dec. 7, 2017

Related U.S. Application Data

(60) Provisional application No. 62/346,186, filed on Jun. 6, 2016.

(51) Int. Cl.
| | |
|---|---|
| C23C 16/06 | (2006.01) |
| C23C 16/455 | (2006.01) |
| C23C 16/08 | (2006.01) |
| C23C 16/02 | (2006.01) |
| C23C 16/42 | (2006.01) |

(52) U.S. Cl.
CPC .... *C23C 16/45527* (2013.01); *C23C 16/0272* (2013.01); *C23C 16/08* (2013.01); *C23C 16/42* (2013.01); *C23C 16/45551* (2013.01)

(58) Field of Classification Search
CPC ....... C23C 16/42; C23C 16/30; C23C 16/455; C23C 16/34; C23C 16/36; C23C 16/06
See application file for complete search history.

(56) References Cited

U.S. PATENT DOCUMENTS

| | | | |
|---|---|---|---|
| 5,981,366 A | 11/1999 | Koyama et al. | |
| 6,287,967 B1* | 9/2001 | Hsieh | H01L 29/41783 |
| | | | 257/E21.438 |
| 6,635,965 B1* | 10/2003 | Lee | H01L 21/28562 |
| | | | 257/754 |
| RE40,114 E | 2/2008 | Sandhu | |
| 7,378,129 B2* | 5/2008 | Kraus | C23C 16/34 |
| | | | 427/255.28 |
| 7,758,697 B2* | 7/2010 | Comita | C01B 33/04 |
| | | | 117/105 |
| 8,012,859 B1 | 9/2011 | Joe et al. | |
| 8,278,216 B1* | 10/2012 | Alers | H01L 21/28556 |
| | | | 438/681 |
| 9,076,843 B2* | 7/2015 | Lee | H01L 23/52 |
| 9,607,842 B1* | 3/2017 | Woodruff | H01L 21/28518 |
| 2003/0190424 A1* | 10/2003 | Sneh | C23C 16/42 |
| | | | 427/255.392 |
| 2004/0050685 A1* | 3/2004 | Yara | C23C 16/4409 |
| | | | 204/164 |
| 2005/0016453 A1* | 1/2005 | Seidel | C23C 16/45525 |
| | | | 118/715 |
| 2006/0024959 A1* | 2/2006 | Li | H01L 21/28061 |
| | | | 438/648 |
| 2008/0042173 A1* | 2/2008 | Nam | H01L 21/28088 |
| | | | 257/288 |
| 2009/0081866 A1* | 3/2009 | Lee | C23C 16/42 |
| | | | 438/655 |
| 2013/0196505 A1* | 8/2013 | Hasegawa | H01L 21/76898 |
| | | | 438/664 |
| 2014/0061784 A1* | 3/2014 | Kang | H01L 29/4966 |
| | | | 257/334 |
| 2015/0194298 A1* | 7/2015 | Lei | H01L 21/0217 |
| | | | 438/680 |
| 2016/0322229 A1* | 11/2016 | Ganguli | H01L 21/28518 |

FOREIGN PATENT DOCUMENTS

| | | |
|---|---|---|
| JP | 2003193233 A | 7/2003 |
| JP | 2009024252 A | 2/2009 |
| KR | 10-2016-0088933 * | 7/2016 |

OTHER PUBLICATIONS

Bernal-Ramos, Karla, et al., "Atomic Layer Deposition of Cobalt Silicide Thin Films Studied by in Situ Infrared Spectroscopy". Chemistry of Materials, 2015, 27, 4943-4949.*
Do, Kwan-Woo, et al., "Formation of Low-Resistivity Nickel Silicide with High Temperature Stability from Atomic-Layer-Deposited Nickel Thin Film". Japanese Journal of Applied Physics, vol. 45, No. 4B, 2006, pp. 2975-2979.*
Kalanyan, Berc, et al., "Low-Temperature Atomic Layer Deposition of Tungsten using Tungsten Hexafluoride and Highly-diluted Silane in Argon". Chemical Vapor Deposition 2013, 19, 161-166. DOI: 10.1002/cvde.201307053.*
Klaus, J.W., et al., "Atomic layer deposition of tungsten using sequential surface chemistry with a sacrificial stripping reaction". Thin Solid Films 360 (2000) 145-153.*

* cited by examiner

*Primary Examiner* — Bret P Chen
(74) *Attorney, Agent, or Firm* — Servilla Whitney LLC

(57) ABSTRACT

Methods for forming a nucleation layer on a substrate. In some embodiments, the processing method comprises sequential exposure to a first reactive gas comprising a metal precursor and a second reactive gas comprising a halogenated silane to form a nucleation layer on the surface of the substrate.

20 Claims, 4 Drawing Sheets

METHODS FOR DEPOSITING TUNGSTEN ON HALOSILANE BASED METAL SILICIDE NUCLEATION LAYERS

CROSS-REFERENCE TO RELATED APPLICATIONS

This application claims priority to U.S. Provisional Application No. 62/346,186, filed Jun. 6, 2016, the entire disclosure of which is hereby incorporated by reference herein.

TECHNICAL FIELD

The present disclosure relates generally to methods of depositing thin films. In particular, the disclosure relates to processes for the deposition of tungsten films by atomic layer deposition.

BACKGROUND

Metal silicides ($WSi_x$ and $MoSi_x$) have been used as a nucleation layer to overcome the incubation delay found on various surface depositions including Si, $SiO_2$, TiN, etc. The metal silicides could be deposited by atomic layer deposition using metal precursors and silanes ($SiH_4$, $Si_2H_6$, etc.) as a co-reactant. However, silane-based metal silicide deposition exhibited high growth per cycle (GPC>5 Å/cycle; typically 10 Å/cycle) and low step coverage on structures with high aspect ratios. The high deposition rate provides poor control over the film thickness. Therefore, there is a need in the art for methods of forming a nucleation layer with improved thickness control.

SUMMARY

One or more embodiments of the disclosure are directed to processing methods comprising positioning a substrate with a surface in a processing chamber. The substrate surface is sequentially exposed to a first reactive gas and a second reactive gas to form a nucleation layer on the surface. The first reactive gas comprises a metal precursor and the second reactive gas comprises a halogenated silane.

Additional embodiments of the disclosure are directed to processing methods comprising positioning a substrate with a surface in a processing chamber. A nucleation layer is formed on the surface by repeating sequential exposure of the substrate surface to a first reactive gas and a second reactive gas. The first reactive gas comprises a metal precursor and the second reactive gas comprises a halogenated silane to form a nucleation layer of a predetermined thickness. A metal film is bulk deposited on the nucleation layer by repeating sequential exposure of the nucleation layer to a third reactive gas and a fourth reactive gas to form a bulk metal film of a predetermined thickness.

Further embodiments of the disclosure are directed to processing methods comprising placing a substrate having a surface into a processing chamber comprising a plurality of process regions; each process region separated from adjacent process regions by a gas curtain. At least a portion of the substrate surface is exposed to a first process condition in a first process region of the processing chamber. The process condition comprises a metal precursor comprising one or more of $WCl_5$, $WCl_6$, $WF_6$, $MoCl_5$, $MoCl_6$ or $MoF_6$. The substrate surface is laterally moved through a gas curtain to a second process region of the processing chamber. The substrate surface is exposed to a second process condition in the second process region of the processing chamber. The second process condition comprises a halogenated silane comprising a compound having the general formula $Si_aH_bX_c$, where X is a halogen, a is 1-5, c is at least one and the sum of b and c equals 2a+2. Exposure to the first process condition and the second process condition is repeated to form a nucleation layer comprising one or more of tungsten silicide or molybdenum silicide with a predetermined thickness in the range of about 5 Å to about 100 Å at a growth rate in the range of about 0.1 Å/cycle to about 10 Å/cycle. The substrate surface is moved to a third process region of the processing chamber. The third process region comprises a third process condition comprising one or more of $WF_6$ or $MoF_6$. The substrate surface is moved to a fourth process region of the processing chamber. The fourth process region comprises a fourth process condition comprising $H_2$. Exposure to the third process condition and the fourth process condition is repeated to form a metal film on the nucleation layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface.

Figure 1:
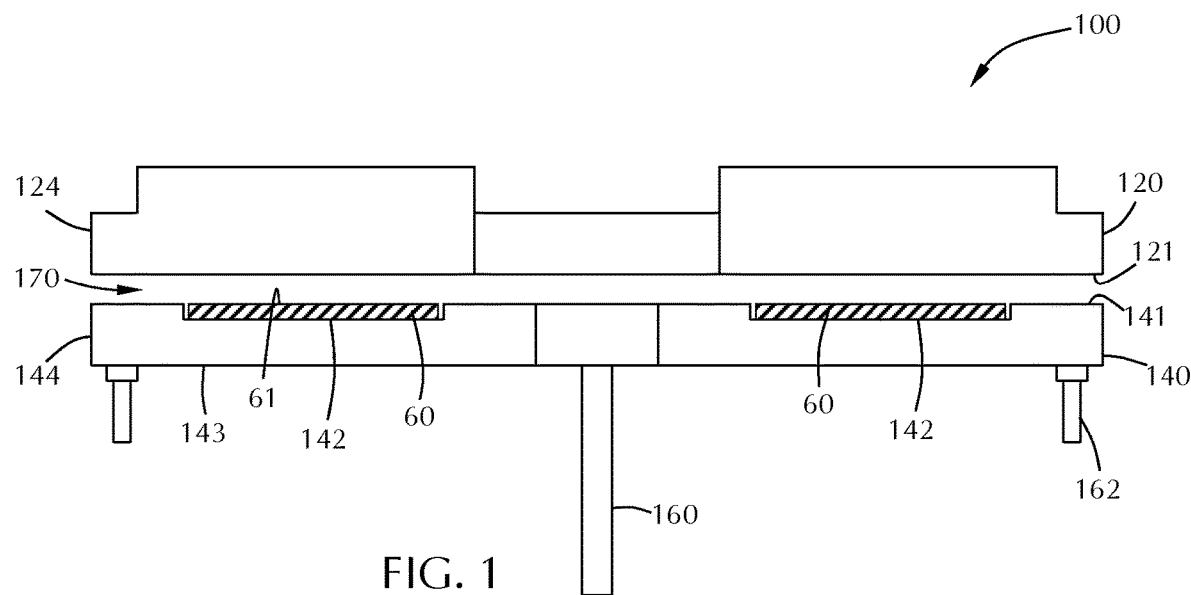
FIG. 1 shows a cross-sectional view of a batch processing chamber in accordance with one or more embodiment of the disclosure.

FIG. 1 shows a cross-section of a processing chamber 100 including a gas distribution assembly 120, also referred to as injectors or an injector assembly, and a susceptor assembly 140. The gas distribution assembly 120 is any type of gas delivery device used in a processing chamber. The gas distribution assembly 120 includes a front surface 121 which faces the susceptor assembly 140. The front surface 121 can have any number or variety of openings to deliver a flow of gases toward the susceptor assembly 140. The gas distribution assembly 120 also includes an outer peripheral edge 124 which in the embodiments shown, is substantially round.

The specific type of gas distribution assembly 120 used can vary depending on the particular process being used. Embodiments of the disclosure can be used with any type of processing system where the gap between the susceptor and the gas distribution assembly is controlled. While various types of gas distribution assemblies can be employed (e.g., showerheads), embodiments of the disclosure may be particularly useful with spatial gas distribution assemblies which have a plurality of substantially parallel gas channels. As used in this specification and the appended claims, the term "substantially parallel" means that the elongate axis of the gas channels extend in the same general direction. There can be slight imperfections in the parallelism of the gas channels. In a binary reaction, the plurality of substantially parallel gas channels can include at least one first reactive gas A channel, at least one second reactive gas B channel, at least one purge gas P channel and/or at least one vacuum V channel. The gases flowing from the first reactive gas A channel(s), the second reactive gas B channel(s) and the purge gas P channel(s) are directed toward the top surface of the wafer. Some of the gas flow moves horizontally across the surface of the wafer and out of the process region through the purge gas P channel(s). A substrate moving from one end of the gas distribution assembly to the other end will be exposed to each of the process gases in turn, forming a layer on the substrate surface.

Figure 2:
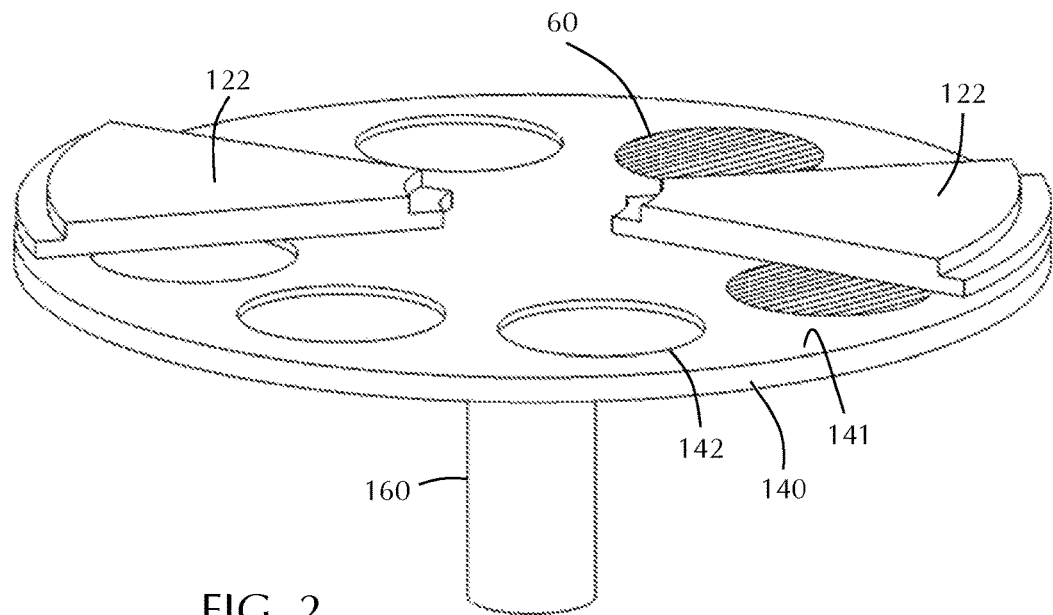
FIG. 2 shows a partial perspective view of a batch processing chamber in accordance with one or more embodiment of the disclosure.

In some embodiments, the gas distribution assembly 120 is a rigid stationary body made of a single injector unit. In one or more embodiments, the gas distribution assembly 120 is made up of a plurality of individual sectors (e.g., injector units 122), as shown in FIG. 2. Either a single piece body or a multi-sector body can be used with the various embodiments of the disclosure described.

A susceptor assembly 140 is positioned beneath the gas distribution assembly 120. The susceptor assembly 140 includes a top surface 141 and at least one recess 142 in the top surface 141. The susceptor assembly 140 also has a bottom surface 143 and an edge 144. The recess 142 can be any suitable shape and size depending on the shape and size of the substrates 60 being processed. In the embodiment shown in FIG. 1, the recess 142 has a flat bottom to support the bottom of the wafer; however, the bottom of the recess can vary. In some embodiments, the recess has step regions around the outer peripheral edge of the recess which are sized to support the outer peripheral edge of the wafer. The amount of the outer peripheral edge of the wafer that is supported by the steps can vary depending on, for example, the thickness of the wafer and the presence of features already present on the back side of the wafer.

In some embodiments, as shown in FIG. 1, the recess 142 in the top surface 141 of the susceptor assembly 140 is sized so that a substrate 60 supported in the recess 142 has a top surface 61 substantially coplanar with the top surface 141 of the susceptor 140. As used in this specification and the appended claims, the term "substantially coplanar" means that the top surface of the wafer and the top surface of the susceptor assembly are coplanar within ±0.2 mm. In some embodiments, the top surfaces are coplanar within 0.5 mm, ±0.4 mm, ±0.35 mm, ±0.30 mm, ±0.25 mm, ±0.20 mm, ±0.15 mm, ±0.10 mm or ±0.05 mm.

The susceptor assembly 140 of FIG. 1 includes a support post 160 which is capable of lifting, lowering and rotating the susceptor assembly 140. The susceptor assembly may include a heater, or gas lines, or electrical components within the center of the support post 160. The support post 160 may be the primary means of increasing or decreasing the gap between the susceptor assembly 140 and the gas distribution assembly 120, moving the susceptor assembly 140 into proper position. The susceptor assembly 140 may also include fine tuning actuators 162 which can make micro-adjustments to susceptor assembly 140 to create a predetermined gap 170 between the susceptor assembly 140 and the gas distribution assembly 120.

In some embodiments, the gap 170 distance is in the range of about 0.1 mm to about 5.0 mm, or in the range of about 0.1 mm to about 3.0 mm, or in the range of about 0.1 mm to about 2.0 mm, or in the range of about 0.2 mm to about 1.8 mm, or in the range of about 0.3 mm to about 1.7 mm, or in the range of about 0.4 mm to about 1.6 mm, or in the range of about 0.5 mm to about 1.5 mm, or in the range of about 0.6 mm to about 1.4 mm, or in the range of about 0.7 mm to about 1.3 mm, or in the range of about 0.8 mm to about 1.2 mm, or in the range of about 0.9 mm to about 1.1 mm, or about 1 mm.

The processing chamber 100 shown in the Figures is a carousel-type chamber in which the susceptor assembly 140 can hold a plurality of substrates 60. As shown in FIG. 2, the gas distribution assembly 120 may include a plurality of separate injector units 122, each injector unit 122 being capable of depositing a film on the wafer, as the wafer is moved beneath the injector unit. Two pie-shaped injector units 122 are shown positioned on approximately opposite sides of and above the susceptor assembly 140. This number of injector units 122 is shown for illustrative purposes only. It will be understood that more or less injector units 122 can be included. In some embodiments, there are a sufficient number of pie-shaped injector units 122 to form a shape conforming to the shape of the susceptor assembly 140. In some embodiments, each of the individual pie-shaped injector units 122 may be independently moved, removed and/or replaced without affecting any of the other injector units 122. For example, one segment may be raised to permit a robot to access the region between the susceptor assembly 140 and gas distribution assembly 120 to load/unload substrates 60.

Figure 3:
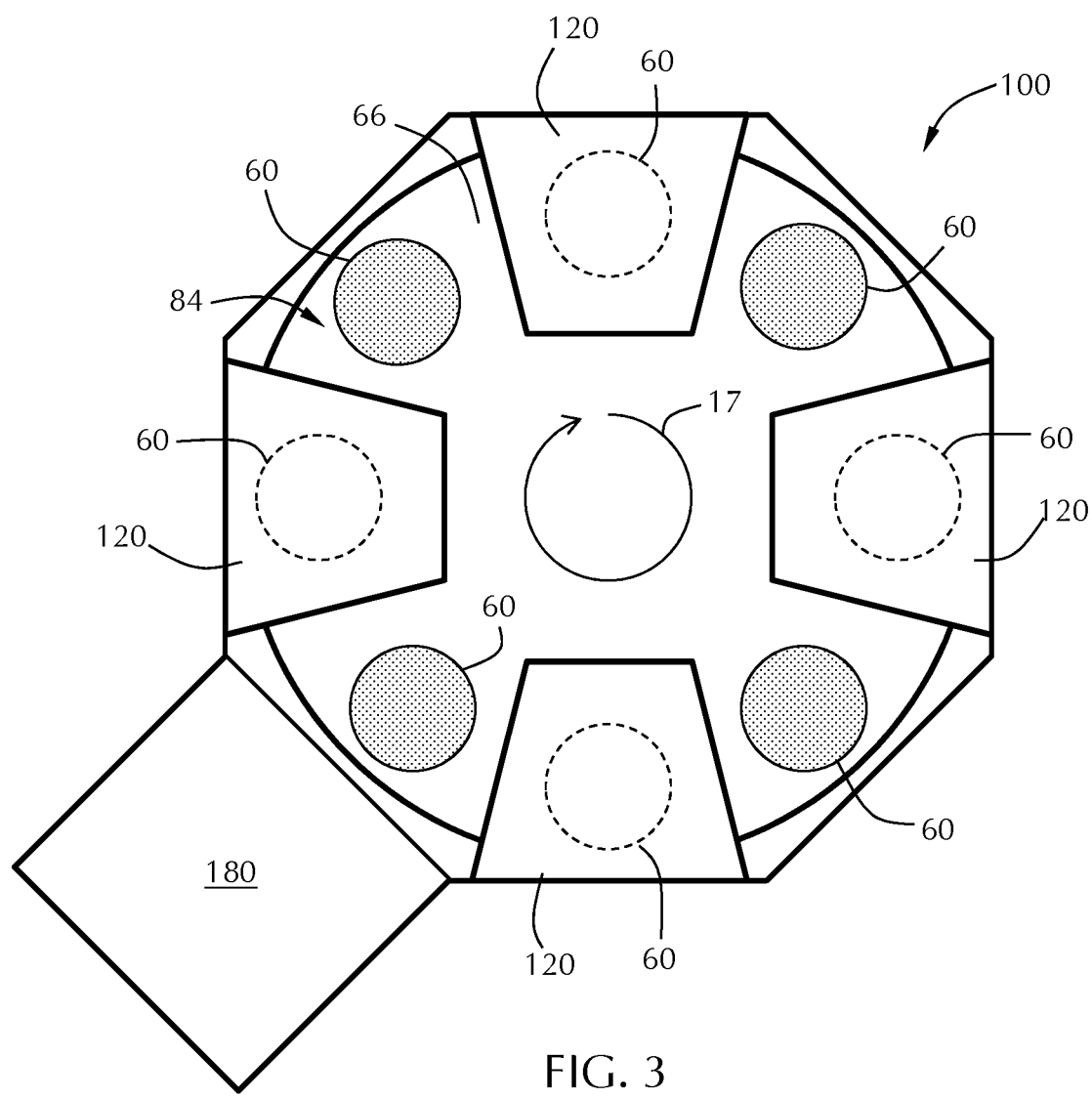
FIG. 3 shows a schematic view of a batch processing chamber in accordance with one or more embodiment of the disclosure.

Processing chambers having multiple gas injectors can be used to process multiple wafers simultaneously so that the wafers experience the same process flow. For example, as shown in FIG. 3, the processing chamber 100 has four gas injector assemblies and four substrates 60. At the outset of processing, the substrates 60 can be positioned between the gas distribution assemblies 120. Rotating 17 the susceptor assembly 140 by 45° will result in each substrate 60 which is between gas distribution assemblies 120 to be moved to an gas distribution assembly 120 for film deposition, as illustrated by the dotted circle under the gas distribution assemblies 120. An additional 45° rotation would move the substrates 60 away from the gas distribution assemblies 120. The number of substrates 60 and gas distribution assemblies 120 can be the same or different. In some embodiments, there are the same numbers of wafers being processed as there are gas distribution assemblies. In one or more embodiments, the number of wafers being processed are fraction of or an integer multiple of the number of gas distribution assemblies. For example, if there are four gas distribution assemblies, there are 4x wafers being processed, where x is an integer value greater than or equal to one. In an exemplary embodiment, the gas distribution assembly 120 includes eight process regions separated by gas curtains and the susceptor assembly 140 can hold six wafers.

The processing chamber 100 shown in FIG. 3 is merely representative of one possible configuration and should not be taken as limiting the scope of the disclosure. Here, the processing chamber 100 includes a plurality of gas distribution assemblies 120. In the embodiment shown, there are four gas distribution assemblies (also called gas distribution assemblies 120) evenly spaced about the processing chamber 100. The processing chamber 100 shown is octagonal; however, those skilled in the art will understand that this is one possible shape and should not be taken as limiting the scope of the disclosure. The gas distribution assemblies 120 shown are trapezoidal, but can be a single circular component or made up of a plurality of pie-shaped segments, like that shown in FIG. 2.

The embodiment shown in FIG. 3 includes a load lock chamber 180, or an auxiliary chamber like a buffer station. This chamber 180 is connected to a side of the processing chamber 100 to allow, for example the substrates (also referred to as substrates 60) to be loaded/unloaded from the processing chamber 100. A wafer robot may be positioned in the chamber 180 to move the substrate onto the susceptor.

Rotation of the carousel (e.g., the susceptor assembly 140) can be continuous or intermittent (discontinuous). In continuous processing, the wafers are constantly rotating so that they are exposed to each of the injectors in turn. In discontinuous processing, the wafers can be moved to the injector region and stopped, and then to the region 84 between the injectors and stopped. For example, the carousel can rotate so that the wafers move from an inter-injector region across the injector (or stop adjacent the injector) and on to the next inter-injector region where the carousel can pause again. Pausing between the injectors may provide time for additional processing steps between each layer deposition (e.g., exposure to plasma).

Figure 4:
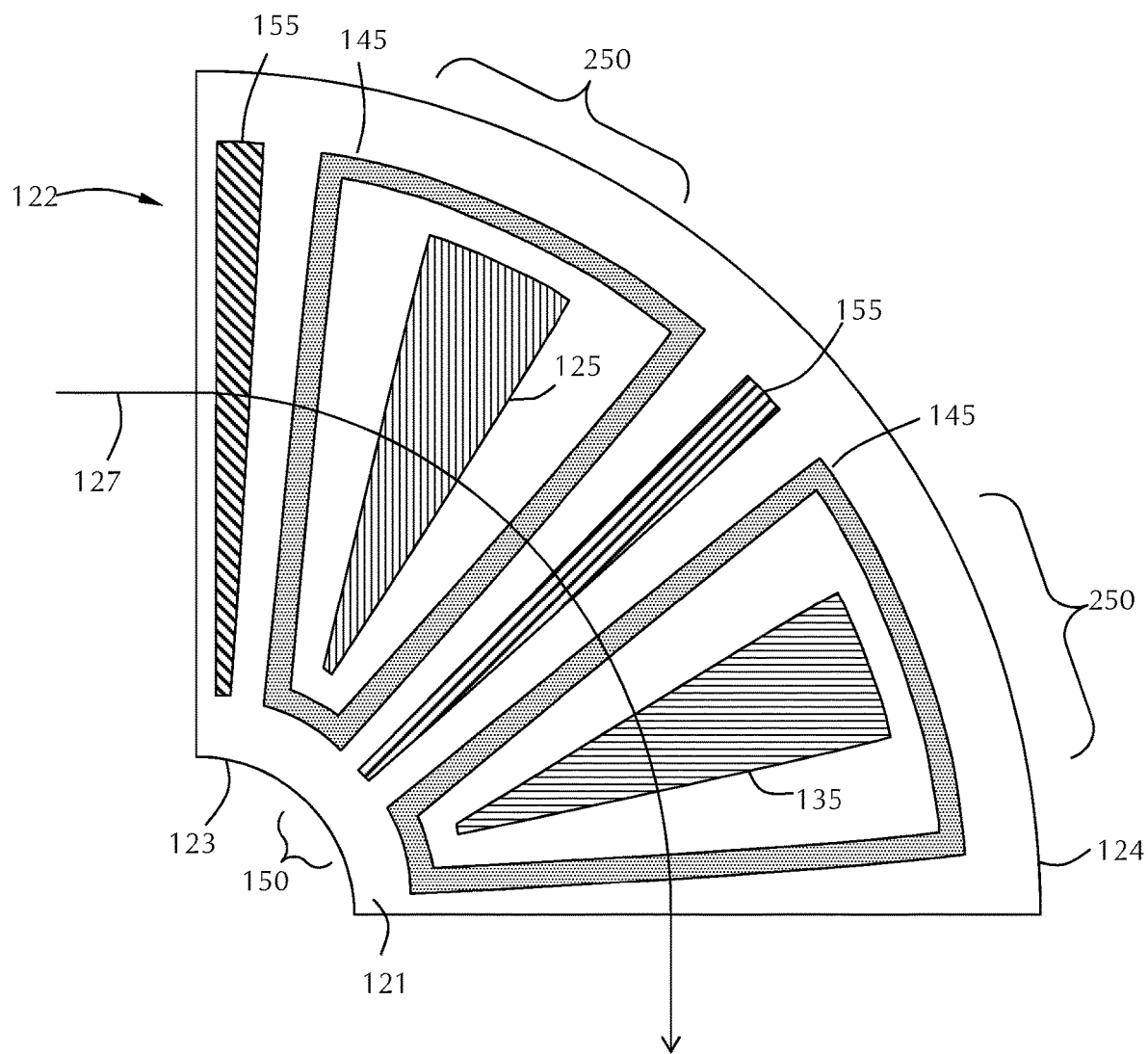
FIG. 4 shows a schematic view of a portion of a wedge shaped gas distribution assembly for use in a batch processing chamber in accordance with one or more embodiment of the disclosure.
Figure 5:
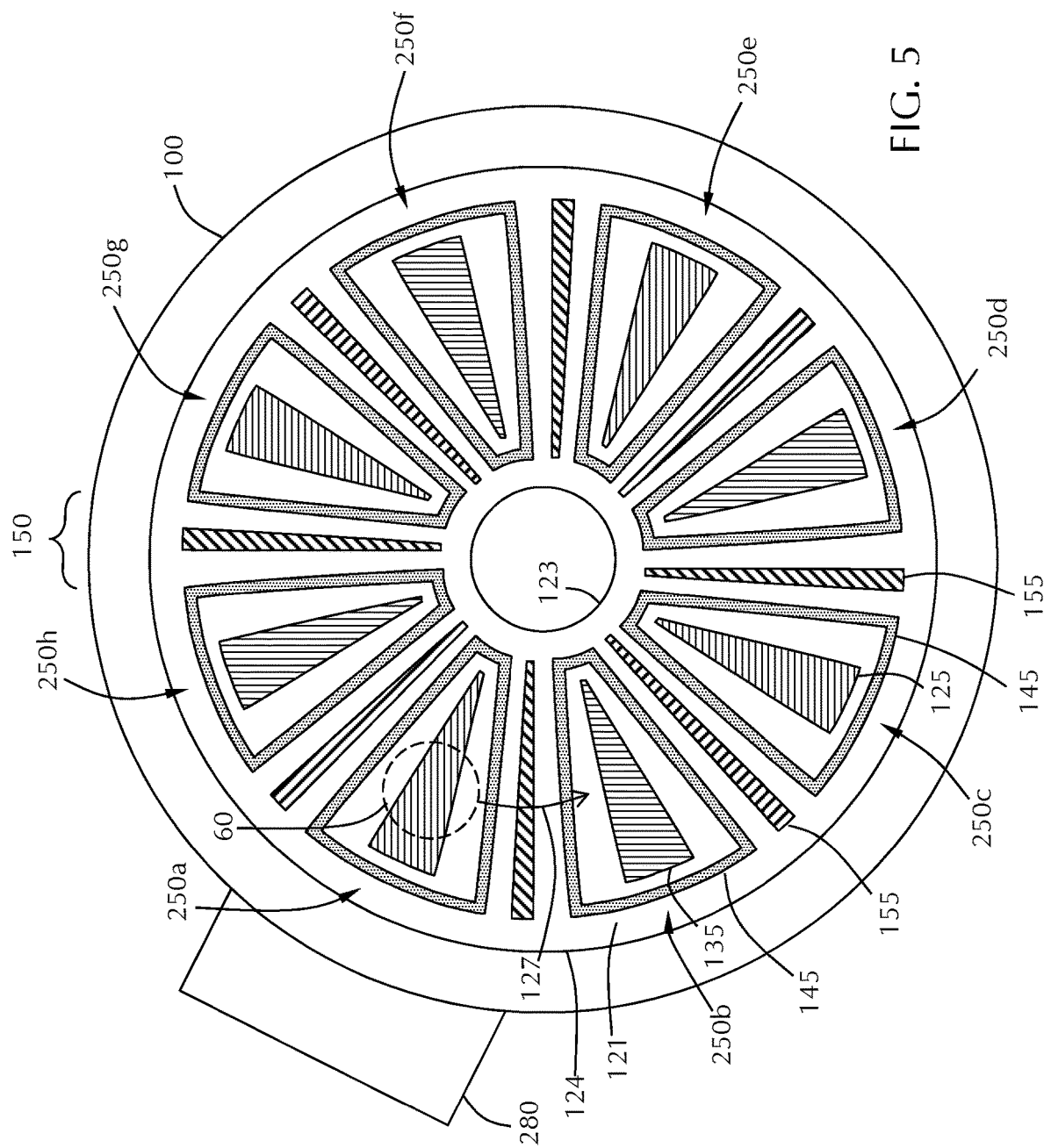
FIG. 5 shows a schematic view of a batch processing chamber in accordance with one or more embodiment of the disclosure.

FIG. 4 shows a sector or portion of a gas distribution assembly 220, which may be referred to as an injector unit 122. The injector units 122 can be used individually or in combination with other injector units. For example, as shown in FIG. 5, four of the injector units 122 of FIG. 4 are combined to form a single gas distribution assembly 220. (The lines separating the four injector units are not shown for clarity.) While the injector unit 122 of FIG. 4 has both a first reactive gas port 125 and a second gas port 135 in addition to purge gas ports 155 and vacuum ports 145, an injector unit 122 does not need all of these components.

Referring to both FIGS. 4 and 5, a gas distribution assembly 220 in accordance with one or more embodiment may comprise a plurality of sectors (or injector units 122) with each sector being identical or different. The gas distribution assembly 220 is positioned within the processing chamber and comprises a plurality of elongate gas ports 125, 135, 155 and vacuum ports 145 in a front surface 121 of the gas distribution assembly 220. The plurality of elongate gas ports 125, 135, 155 and vacuum ports 145 extend from an area adjacent the inner peripheral edge 123 toward an area adjacent the outer peripheral edge 124 of the gas distribution assembly 220. The plurality of gas ports shown include a first reactive gas port 125, a second gas port 135, a vacuum port 145 which surrounds each of the first reactive gas ports and the second reactive gas ports and a purge gas port 155.

With reference to the embodiments shown in FIG. 4 or 5, when stating that the ports extend from at least about an inner peripheral region to at least about an outer peripheral region, however, the ports can extend more than just radially from inner to outer regions. The ports can extend tangentially as vacuum port 145 surrounds reactive gas port 125 and reactive gas port 135. In the embodiment shown in FIGS. 4 and 5, the wedge shaped reactive gas ports 125, 135 are surrounded on all edges, including adjacent the inner peripheral region and outer peripheral region, by a vacuum port 145.

Referring to FIG. 4, as a substrate moves along path 127, each portion of the substrate surface is exposed to the various reactive gases. To follow the path 127, the substrate will be exposed to, or "see", a purge gas port 155, a vacuum port 145, a first reactive gas port 125, a vacuum port 145, a purge gas port 155, a vacuum port 145, a second gas port 135 and a vacuum port 145. Thus, at the end of the path 127 shown in FIG. 4, the substrate has been exposed to a first reactive gas from the first reactive gas port 125 and a second reactive gas from the second reactive gas port 135 to form a layer. The injector unit 122 shown makes a quarter circle but could be larger or smaller. The gas distribution assembly 220 shown in FIG. 5 can be considered a combination of four of the injector units 122 of FIG. 4 connected in series.

The injector unit 122 of FIG. 4 shows a gas curtain 150 that separates the reactive gases. The term "gas curtain" is used to describe any combination of gas flows or vacuum that separate reactive gases from mixing. The gas curtain 150 shown in FIG. 4 comprises the portion of the vacuum port 145 next to the first reactive gas port 125, the purge gas port 155 in the middle and a portion of the vacuum port 145 next to the second gas port 135. This combination of gas flow and vacuum can be used to prevent or minimize gas phase reactions of the first reactive gas and the second reactive gas.

Referring to FIG. 5, the combination of gas flows and vacuum from the gas distribution assembly 220 form a separation into a plurality of process regions 250. The process regions are roughly defined around the individual gas ports 125, 135 with the gas curtain 150 between 250. The embodiment shown in FIG. 5 makes up eight separate process regions 250 with eight separate gas curtains 150 between. A processing chamber can have at least two process region. In some embodiments, there are at least three, four, five, six, seven, eight, nine, 10, 11 or 12 process regions.

During processing a substrate may be exposed to more than one process region 250 at any given time. However, the portions that are exposed to the different process regions will have a gas curtain separating the two. For example, if the leading edge of a substrate enters a process region including the second gas port 135, a middle portion of the substrate will be under a gas curtain 150 and the trailing edge of the substrate will be in a process region including the first reactive gas port 125.

A factory interface 280, which can be, for example, a load lock chamber, is shown connected to the processing chamber 100. A substrate 60 is shown superimposed over the gas distribution assembly 220 to provide a frame of reference. The substrate 60 may often sit on a susceptor assembly to be held near the front surface 121 of the gas distribution assembly 120. The substrate 60 is loaded via the factory interface 280 into the processing chamber 100 onto a substrate support or susceptor assembly (see FIG. 3). The substrate 60 can be shown positioned within a process region because the substrate is located adjacent the first reactive gas port 125 and between two gas curtains 150a, 150b. Rotating the substrate 60 along path 127 will move the substrate counter-clockwise around the processing chamber 100. Thus, the substrate 60 will be exposed to the first process region 250a through the eighth process region 250h, including all process regions between.

Embodiments of the disclosure are directed to processing methods comprising a processing chamber 100 with a plurality of process regions 250a-250h with each process region separated from an adjacent region by a gas curtain 150. For example, the processing chamber shown in FIG. 5. The number of gas curtains and process regions within the processing chamber can be any suitable number depending on the arrangement of gas flows. The embodiment shown in FIG. 5 has eight gas curtains 150 and eight process regions 250a-250h.

A plurality of substrates 60 are positioned on a substrate support, for example, the susceptor assembly 140 shown FIGS. 1 and 2. The plurality of substrates 60 are rotated around the process regions for processing. Generally, the gas curtains 150 are engaged (gas flowing and vacuum on) throughout processing including periods when no reactive gas is flowing into the chamber.

Accordingly, one or more embodiments of the disclosure are directed to processing methods utilizing a batch processing chamber like that shown in FIG. 5. A substrate 60 is placed into the processing chamber which has a plurality of sections or process regions 250, each section separated from adjacent section by a gas curtain 150.

Some embodiments of the disclosure advantageously provide methods for forming metal silicate nucleation layers with improved growth per cycle control. Some embodiments advantageously provide methods for forming nucleation layers with excellent step coverage. One or more embodiments advantageously provide methods for tungsten ALD processes that include, but are not limited to, 3D-NAND wordline, DRAM buried wordline for 1x/y/z generation, source/drain contact and gate metal in CMOS for 10/7/5 nm technology nodes.

One or more embodiments of the disclosure are directed to processing methods comprising positioning a substrate with a surface in a processing chamber. As used in this regard, "positioning" the substrate can be any process or procedure that places a substrate to be processed in a processing chamber. Positioning can be manual or automated.

Conventionally, silane is used as a reducing agent for metal halogenides ($MF_6$, $MCl_6$, $MCl_6$; where M=W and/or Mo). Due to incomplete reaction, the byproducts are usually H-containing fluorosilanes ($SiH_xF_y$) which are highly reactive and can re-deposit on the substrate, causing non-conformal nucleation layer formation. Accordingly, embodiments of the disclosure advantageously provide halogen-containing silanes as reducing agents. The halogen-containing silanes (or halogenated silanes) have fewer hydrogens per molecule than silane, reducing the chances of incomplete reactions, and the halogenated silanes have lower reactivity compared to silanes, so growth control is more feasible. Halogen-containing silane can provide improved step coverage and better growth control.

Some embodiments are directed to process integration schemes for W and Mo ALD processes. A $WSi_x$ (or $MoSi_x$) nucleation layer is deposited by ALD using metal precursor and halogen-containing silane as a co-reactant. A W (or Mo) film can be deposited on the nucleation layer by ALD using a metal precursor and $H_2$ as a co-reactant.

The substrate is sequentially exposed to a first reactive gas and a second reactive gas to form a nucleation layer on the surface of the substrate. As used in this regard, "sequential" exposure means that the reactive gases are exposed to the substrate surface one after another. In a sequential exposure, there is little or no gas phase mixing of the reactive gases.

The first reactive gas comprises a metal precursor. Suitable metal precursors include, but are not limited to, $WCl_5$, $WCl_6$, $WF_6$, $MoCl_5$, $MoCl_6$ or $MoF_6$. In some embodiments, the first reactive gas comprises one or more of $WCl_5$, $WCl_6$, $WF_6$, $MoCl_5$, $MoCl_6$ and/or $MoF_6$. In some embodiments, the first reactive gas consists essentially a species selected from the group consisting of $WCl_5$, $WCl_6$, $WF_6$, $MoCl_5$, $MoCl_6$ and $MoF_6$. As used in this regard, "consisting essentially of" means that greater than or equal to about 95% of the reactive species in the first reactive gas is the specified species. The first reactive gas can include diluents gases and carrier gases while still consisting essentially of the specified species.

In some embodiments, the metal precursor comprises tungsten atoms or a tungsten species and the nucleation layer comprises tungsten silicide. In some embodiments, the metal precursor comprises molybdenum atoms or a molybdenum species and the nucleation layer comprises molybdenum silicide.

The second reactive gas of some embodiments comprises a halogenated silane. Suitable halogenated silanes can include any compound with silicon and halogen atoms. In some embodiments, the halogenated silane comprises a compound having the general formula $Si_aH_bX_c$, where X is a halogen, a is 1-5, c is at least one and the sum of b and c equals 2a+2. In some embodiments, the halogenated silane has each X independently selected from the group consisting of Cl and F, a is in the range of about 1 to about 2, and c is greater than 1. In some embodiments, the halogenated silane comprises substantially no Br or I atoms. As used in this regard, "substantially no" means that there is less than or equal to about 5 atomic % Br and I based on the total number of halogen atoms.

In some embodiments, the second reactive gas consists essentially of a compound having the general formula $Si_aH_bX_c$, where X is a halogen, a is 1-5, c is at least one and the sum of b and c equals 2a+2. As used in this regard, "consisting essentially of" means that greater than or equal to about 95% of the reactive species in the second reactive gas has the specified general formula. The second reactive gas can include diluents gases, carrier gases or inert gases while still consisting essentially of the specified species.

In one or more embodiments, the second reactive gas further comprises a silane or an inert gas. Suitable silanes include, but are not limited to, $SiH_4$, $Si_2H_6$, $Si_3H_8$, $Si_4H_{10}$, $Si_5H_{12}$ and higher order silanes having the general formula $Si_xH_{2x+2}$.

In some embodiments, the nucleation layer has a growth rate in the range of about 0.1 to about 10 Å/cycle. In one or more embodiments, the nucleation layer has a growth rate greater than or equal to about 0.1 Å/cycle and less than or equal to about 10, 9, 8, 7, 6, 5, 4, 3, 2 or 1 Å/cycle.

Some embodiments further comprise repeating the sequential exposure to the first reactive gas and the second reactive gas to grow a nucleation layer of a target or predetermined thickness. The target or predetermined thickness of the nucleation layer is in the range of 5 Å to about 100 Å, or in the range of about 6 Å to about 90 Å, or in the range of about 7 Å to about 70 Å, or in the range of about 8 Å to about 50 Å, or in the range of about 9 Å to about 30 Å

The nucleation layer can be formed at any suitable temperature and pressure. In some embodiments, the nucleation layer is formed at a temperature in the range of about 100° C. to about 700° C., or in the range of about 200° C. to about 600° C., or in the range of about 350° C. to about 550° C., or in the range of about 400° C. to about 500° C. In some embodiments, the nucleation layer is formed at a pressure in the range of about 0.01 Torr to about 100 Torr, or in the range of about 1 Torr to about 75 Torr, or in the range of about 10 Torr to about 50 Torr, or in the range of about 20 Torr to about 40 Torr.

After formation of the nucleation layer, some embodiments further comprise performing a bulk metal deposition on the nucleation layer. The bulk metal deposition of some embodiments comprises sequential exposure to a third reactive gas and a fourth reactive gas.

In some embodiments, the third reactive gas comprises one or more of $WF_6$ or $MoF_6$ and the fourth reactive gas comprising $H_2$. In one or more embodiments, the fourth reactive gas comprises a plasma, such as a hydrogen plasma.

Some embodiments of the method comprise exposing a substrate surface having a feature thereon to a deposition environment to deposit a film. As used in this regard, a "deposition environment" comprises one or more process regions or process conditions that individually or sequentially deposit a film.

In an exemplary process, at least a portion of the substrate surface is exposed to a first process condition in a first process region 250a of the processing chamber. The first process condition of some embodiments comprises a metal precursor. The metal precursor of some embodiments comprises one or more of $WCl_5$, $WCl_6$, $WF_6$, $MoCl_5$, $MoCl_6$ or $MoF_6$.

The substrate surface is laterally moved through a gas curtain 150 to a second process region 250b and is exposed to a second process condition in the second process region 250b. The second process condition comprises a halogenated silane. In some embodiments, the halogenated silane comprises a compound having the general formula $Si_aH_bX_c$, where X is a halogen, a is 1-5, c is at least one and the sum of b and c equals 2a+2.

The exposure to the first process condition and the second process condition can be repeated to form a nucleation layer with a predetermined thickness. For example, referring to FIG. 5, the first process region 250a, third process region 250c, fifth process region 250e and seventh process region 250g may comprise the first process condition; the second process region 250b, fourth process region 250d, sixth process region 250f and eighth process region 250h may comprise the second process condition. In this arrangement, each rotation of the substrate forms four layers. Those skilled in the art will understand that the use of ordinals such as "first" and "second" to describe process regions do not imply a specific location within the processing chamber, or order of exposure within the processing chamber.

After formation of the nucleation layer, the reactive gases in the first process condition and the second process condition can be changed to allow a bulk deposition of a metal film on the nucleation layer. In some embodiments, bulk deposition comprises moving the substrate surface to a third process region of the processing chamber comprising a third process condition a metal precursor. In some embodiments, the third process condition comprises one or more of $WF_6$ or $MoF_6$.

The substrate surface is laterally moved through a gas curtain 150 to a fourth process region 250d and is exposed to a fourth process condition. The fourth process condition comprises hydrogen. In some embodiments, the fourth process condition comprises a hydrogen plasma.

The exposure to the third process condition and the fourth process condition can be repeated to form a film with a predetermined thickness. For example, referring to FIG. 5, after changing the first process condition and the second process condition, the first process region 250a, third process region 250c, fifth process region 250e and seventh process region 250g may comprise the third process condition; the second process region 250b, fourth process region 250d, sixth process region 250f and eighth process region 250h may comprise the fourth process condition. In this arrangement, each rotation of the substrate forms four layers. Those skilled in the art will understand that the use of ordinals such as "first" and "second" to describe process regions do not imply a specific location within the processing chamber, or order of exposure within the processing chamber.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, annealing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, anneal, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

In atomic layer deposition type chambers, the substrate can be exposed to the first and second precursors either spatially or temporally separated processes. Temporal ALD is a traditional process in which the first precursor flows into the chamber to react with the surface. The first precursor is purged from the chamber before flowing the second precursor. In spatial ALD, both the first and second precursors are simultaneously flowed to the chamber but are separated spatially so that there is a region between the flows that prevents mixing of the precursors. In spatial ALD, the substrate is moved relative to the gas distribution plate, or vice-versa.

In embodiments, where one or more of the parts of the methods takes place in one chamber, the process may be a spatial ALD process. Although one or more of the chemistries described above may not be compatible (i.e., result in reaction other than on the substrate surface and/or deposit on the chamber), spatial separation ensures that the reagents are not exposed to each in the gas phase. For example, temporal ALD involves the purging the deposition chamber. However, in practice it is sometimes not possible to purge the excess reagent out of the chamber before flowing in additional regent. Therefore, any leftover reagent in the chamber may react. With spatial separation, excess reagent does not need to be purged, and cross-contamination is limited. Furthermore, a lot of time can be used to purge a chamber, and therefore throughput can be increased by eliminating the purge step.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A processing method comprising:
   positioning a substrate with a surface in a processing chamber;
   forming a nucleation layer on the surface of the substrate by a deposition process comprising sequentially exposing the substrate surface to a first reactive gas and a second reactive gas, the first reactive gas comprising a metal precursor and the second reactive gas comprising a halogenated silane, and the nucleation layer having a growth rate in the range of about 0.1 to about 10 Å/cycle; and
   performing a bulk metal deposition on the nucleation layer.

2. The method of claim 1, wherein the metal precursor comprises one or more of $WCl_5$, $WF_6$, $MoCl_5$, $MoCl_6$ or $MoF_6$.

3. The method of claim 1, wherein the halogenated silane comprises a compound having the general formula $Si_aH_bX_c$, where X is a halogen, a is 1-5, c is at least one and the sum of b and c equals 2a+2.

4. The method of claim 3, wherein the halogenated silane has each X independently selected from the group consisting of Cl and F, a is in the range of about 1 to about 2, and c is greater than 1.

5. The method of claim 1, wherein the metal precursor comprises tungsten and the nucleation layer comprises tungsten silicide.

6. The method of claim 1, wherein the metal precursor comprises molybdenum and the nucleation layer comprises molybdenum silicide.

7. The method of claim 1, wherein the second reactive gas further comprises a silane.

8. The method of claim 1, wherein the nucleation layer has a growth rate greater than or equal to about 0.1 Å/cycle and less than or equal to about 5 Å/cycle.

9. The method of claim 1, wherein the halogenated silane comprises substantially no Br or I atoms.

10. The method of claim 1, further comprising repeating the sequential exposure to the first reactive gas and the second reactive gas to grow a nucleation layer of a target thickness.

11. The method of claim 1, the bulk metal deposition comprises sequential exposure to a third reactive gas and a fourth reactive gas.

12. The method of claim 11, wherein the third reactive gas comprises one or more of $WF_6$ or $MoF_6$ and the fourth reactive gas comprises $H_2$.

13. The method of claim 12, wherein the fourth reactive gas is a plasma.

14. The method of claim 1, wherein the nucleation layer is formed at a temperature in the range of about 350° C. to about 550° C.

15. A processing method comprising:
placing a substrate with a surface in a processing chamber;
forming a nucleation layer on the surface by repeating sequential exposure of the substrate surface to a first reactive gas and a second reactive gas, the first reactive gas comprising a metal precursor and the second reactive gas comprising a halogenated silane to form a nucleation layer of a predetermined thickness, the nucleation layer having a growth rate in the range of about 0.1 to about 10 Å/cycle; and
bulk depositing a metal film on the nucleation layer by repeating sequential exposure of the nucleation layer to a third reactive gas and a fourth reactive gas to form a bulk metal film of a predetermined thickness.

16. The method of claim 15, wherein the metal precursor comprises one or more of $WCl_5$, $WF_6$, $MoCl_5$, $MoCl_6$ or $MoF_6$.

17. The method of claim 15, wherein the halogenated silane comprises a compound having the general formula $Si_aH_bX_c$, where X is a halogen, a is 1-5, c is at least one and the sum of b and c equals 2a+2.

18. The method of claim 15, wherein the nucleation layer has a growth rate greater than or equal to about 0.1 Å/cycle and less than or equal to about 5 Å/cycle.

19. The method of claim 15, wherein the third reactive gas comprises one or more of $WF_6$ or $MoF_6$ and the fourth reactive gas comprises $H_2$.

20. A processing method comprising:
placing a substrate having a surface into a processing chamber comprising a plurality of process regions, each process region separated from adjacent process regions by a gas curtain;
exposing at least a portion of the substrate surface to a first process condition in a first process region of the processing chamber, the first process condition comprising a metal precursor comprising one or more of $WCl_5$, $WCl_6$, $WF_6$, $MoCl_5$, $MoCl_6$ or $MoF_6$;
laterally moving the substrate surface through a gas curtain to a second process region of the processing chamber;
exposing the substrate surface to a second process condition in the second process region of the processing chamber, the second process condition comprises a halogenated silane comprising a compound having the general formula $Si_aH_bX_c$, where X is a halogen, a is 1-5, c is at least one and the sum of b and c equals 2a+2;
repeating exposure to the first process condition and the second process condition to form a nucleation layer comprising one or more of tungsten silicide or molybdenum silicide with a predetermined thickness in the range of about 5 Å to about 100 Å at a growth rate in the range of about 0.1 Å/cycle to about 10 Å/cycle;
moving the substrate surface to a third process region of the processing chamber, the third process region comprising a third process condition comprising one or more of $WF_6$ or $MoF_6$;
moving the substrate to a fourth process region of the processing chamber, the fourth process region comprising a fourth process condition comprising $H_2$; and
repeating exposure to the third process condition and the fourth process condition to form a metal film on the nucleation layer.

* * * * *